United States Patent
Foster, Sr. et al.

(10) Patent No.: US 7,120,019 B2
(45) Date of Patent: Oct. 10, 2006

(54) COAXIAL AIR DUCTS AND FANS FOR COOLING AND ELECTRONIC COMPONENT

(75) Inventors: Jimmy Grant Foster, Sr., Morrisville, NC (US); Michael Sean June, Raleigh, NC (US); Albert Vincent Makley, Raleigh, NC (US); Jason Aaron Matteson, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 10/920,575

(22) Filed: Aug. 18, 2004

(65) Prior Publication Data

US 2006/0039110 A1    Feb. 23, 2006

(51) Int. Cl.
*H05K 7/20* (2006.01)

(52) U.S. Cl. ............... 361/695; 361/695; 361/697; 165/80.3; 415/61; 415/68; 415/77; 415/220

(58) Field of Classification Search ............... 361/690, 361/694, 695, 697; 165/80.2, 80.3, 122, 165/185; 174/16.3; 257/706, 721, 722; 415/61, 66, 68–69, 77, 220
See application file for complete search history.

(56) References Cited

U.S. PATENT DOCUMENTS

| | | | |
|---|---|---|---|
| 5,953,209 A | 9/1999 | Chiu | |
| 6,172,415 B1 | 1/2001 | Miyahara et al. | |
| 6,181,556 B1 | 1/2001 | Allman | |
| 6,343,014 B1 | 1/2002 | Lin | |
| 6,367,542 B1 | 4/2002 | Chen | |
| 6,537,019 B1 | 3/2003 | Dent | |
| 6,575,231 B1* | 6/2003 | Wu | 165/121 |
| 6,664,673 B1 | 12/2003 | Lopatinsky et al. | |
| 6,948,555 B1* | 9/2005 | Garcia | 165/80.3 |
| 6,951,449 B1* | 10/2005 | Huang et al. | 417/368 |
| 2002/0167798 A1 | 11/2002 | Jin-Yuan | |
| 2002/0170703 A1 | 11/2002 | Huang et al. | |
| 2002/0172008 A1 | 11/2002 | Michael | |
| 2003/0007867 A1* | 1/2003 | Chang | 415/220 |
| 2003/0021679 A1 | 1/2003 | Antony | |
| 2003/0030980 A1 | 2/2003 | Bird et al. | |
| 2005/0199369 A1* | 9/2005 | Chen | 165/80.3 |

FOREIGN PATENT DOCUMENTS

JP    2001281983    10/2001

* cited by examiner

*Primary Examiner*—Lynn Feild
*Assistant Examiner*—Robert J. Hoffberg
(74) *Attorney, Agent, or Firm*—Cynthia S. Byrd; Ronald V. Davidge

(57) ABSTRACT

A structure for cooling an electronic component includes a heat sink attached to the component, an inner air duct extending into a central portion of the heat sink, and an outer air duct extending into an outer portion of the heat sink. In inner fan, within the inner air duct, moves air in one direction, while an outer fan, in the outer air duct, moves air in the other direction. The fans may be built as separate rotors, or as separate portions of a single rotor.

20 Claims, 4 Drawing Sheets

COAXIAL AIR DUCTS AND FANS FOR COOLING AND ELECTRONIC COMPONENT

BACKGROUND OF THE INVENTION

1. Field of the Invention

This invention relates to apparatus for cooling electronic components, and, more particularly, to such apparatus including one or more locally mounted fan units directing air to move along surfaces of a heat sink.

2. Summary of the Background Art

Many electronic devices, including laptop computers and workstations, are being designed with structures including heat sinks and fans for cooling individual circuit modules. Such a conventional cooling structures typically includes an axial-flow fan attached to extend horizontally along the top of a heat sink, which is in turn mounted to extend upward from the circuit module being cooled. The airflow from the fan is directed downward among cooling fins of the heat sink to make a 90-degree turn upon impinging upon the body of the heat sink, from which the fins extend upward, with heated air then flowing outward around the periphery of the heat sink. Problems associated with this conventional approach include a pressure drop that is created when the airflow impinges on the body of the heat sink, due to an associated reduction in the rate of airflow, and due to the fact that heated air is exhausted outward from the periphery of the heat sink. Often, additional critical components cannot be placed on the circuit board near the heat sink because of the presence of heated air. Thus, what is needed is a component cooling system that takes air from a space above the components and that returns heated air to the space above the components.

U.S. Pat. No. 6,664,673 describes a cooler for electronic devices comprising a heat exchange element, a rotor including an axial-flow fan and a blower with a radial impeller, and an electric drive rotating the rotor. Cooling air is driven downward by the axial flow fan past a number of heat sink surfaces, extending upward as pillars from the heat sink body. Then, from this central area, air is driven outward by the radial impeller, past a number of heat sink surfaces extending around the radial impeller, and outward from the periphery of the heat sink. Certain versions include a duct extending around this periphery, so that air is directed outward only from one end of the heat sink. One problem associated with this method is the space taken up along the circuit board, with space being provided for the radial impeller. Additionally, what is still needed is a component cooling system that returns heated air to the space above the components.

U.S. Pat. No. 6,367,542 describes a cooling assembly including a heat sink, an internal fan, a fan frame, and an external fan. The heat sink includes a base and a fin member attached to the base. The fin member includes a central portion and a plurality of fins extending radially from the central portion. A central cavity is defined in the fin member, surrounded by the fins. The internal fan is received in the central cavity to be supported by the central portion at the bottom of the cavity. The fan frame has an opening defined therein, and is mounted on the heat sink, with the external fan being mounted on the fan frame to cover the opening. Cooling air enters the external fan and is into the cavity. The internal fan accelerates airflow from upper portions of the fin member to lower portions thereof. The air then exits around the periphery of the heat sink. Again, what is needed is a cooling system that returns heated air to the space above the components.

U.S. Pat. App. Pub. No. 2003/0021679 describes a fan structure used with a heat sink, with the fan structure including an axle having first and second fan members at opposite ends, with blades of the two fan structures being angled in opposite directions. The first fan member is installed to extend along the top of the heat sink, while the second fan member is embedded into the heat sink. The heat sink includes an outer portion, in which fins extend, and an inner portion, connected to the outer portion through slots at the bottom at the inner portion and through an opening at the top of the inner portion, between the first and second fans. Heated air is pushed outward through a slot extending around the outer portion. Again, what is needed is a cooling system that returns heated air to the space above the components.

Other examples of the patent literature describe pairs of cooling fans installed in line with one another so that the output air from a first fan is directed to the input of a second fan. For example, U.S. Pat. No. 6,537,019 describes such a pair of fans rotating in opposite directions, with blades being angled in opposite directions, and with axes of rotation being aligned or slightly offset. U.S. Pat. No. 6,343,014 describes such fans as being mounted on a heat sink, separated by a spacer, and connected in series. U.S. Pat. App. Pub. No. 2002/0170703 describes such a pair of fans in which the fans are controlled in series, with the first fan being controlled by a first control circuit, and the second fan being controlled by a second control circuit, so that the second control circuit increases the speed of the second fan when the first fan fails. U.S. Pat. App. Pub. No. 2002/0167798 describes a heat-dissipating assembly including a heat sink having a base in contact with a surface of a heat-generating device and a plurality of fins extending upwards from the base, and a first fan and a second fan respectively disposed on a first position and a second position of the heat sink.

Other patents describe cooling fans being mounted in a side-by-side configuration. For example, U.S. Pat. No. 5,953,209 describes a pair of fans mounted side-by-side on a heat sink mounted in turn on an electronic cartridge, with one of the fans pushing air into the heat sink while the other fan pulls air out of the heat sink. U.S. Pat. No. 6,172,416 describes apparatus including a plurality of fans mounted to blow air along a heat sink substrate to cool a plurality of electronic devices. Adjacent fans may move air in the same direction or in opposite directions, with the heat sink substrate additionally providing electromagnetic shielding. U.S. Pat. No. 6,181,556 describes a thermally coupled heat-dissipation apparatus surrounding a solid-state electronic device or a thermal transfer column extending upward from a main board socketed device. What is needed is a relatively small cooling system for cooling a single electronic device while occupying a minimum space on the circuit card.

Japanese Patent No. 2001291983 describes a low cooling system for use within a notebook computer, where space above a circuit board is particularly limited. The cooling system includes two fans having rotary impellers, mounted side by side within a duct of limited thickness, producing airflow in a common direction, particularly in an area between the fans.

The patent literature includes other examples of devices including fans and heat sinks to solve problems that are more specific. For example, U.S. Pat. App. Pub. No. describes apparatus for cooling electronic components on a plug-in circuit board within an enclosure. Air is drawn from along an edge of the card by a single fan, to be driven past a high-energy power dissipating device, such as a graphical processor unit and over arrays of memory chips. U.S. Pat.

App. Pub. No. 2003/0030980 describes a thermo-electro subassembly including a gas supply, a first duct, a first heat sink adjacent a first device, a second duct, and a second heart sink adjacent a second device. The gas supply may be realized as a fan, a blower, or a source of compressed gas.

SUMMARY OF THE INVENTION

In accordance with a first aspect of the invention, apparatus for cooling a component is provided, with the apparatus including a heat sink, outer and inner air ducts, an outer fan within the outer air duct, and an inner fan within the inner air duct. The heat sink, which extends from a surface of the component, includes a central portion and an outer portion. The inner air duct extends away from an opening to the outer air duct adjacent a central portion of the heat sink. The outer air duct extends along the inner air duct, within an annular space around the inner air duct. The outer fan moves air in a first direction through the outer air duct. The inner fan moves air opposite the first direction through the inner air duct.

In a first embodiment of the invention, the inner fan includes an inner rotor, spaced away from the outer fan, and the outer fan includes an outer rotor, turning separately from the inner rotor. The outer rotor, which is rotatably mounted at a first motor disposed at a center of the outer rotor, includes a cylindrical wall, a number of elongated members extending between the motor and an inner surface of the cylindrical wall, and a number of fan blades extending outward from an outer surface of the cylindrical wall to move air in the first direction through the outer air duct. The internal surface of the cylindrical wall forms a portion of the inner air duct, while the outer surface of the cylindrical wall forms a portion of the outer air duct.

In a second embodiment of the invention, the inner fan includes blades extending within an inner portion of a rotor, and the outer fan includes blades extending within an outer portion of the same rotor. The rotor, which is rotatably mounted at a motor disposed at a center of the rotor, includes a cylindrical wall, a number of fan blades extending between the motor and an inner surface of the cylindrical wall to move air opposite the first direction within the inner air duct, and a number of fan blades extending outwardly from an outer surface of the cylindrical wall to move air in the first direction within the outer air duct.

The heat sink preferably includes a web extending along the surface of the component, a number of fins extending from the web within the inner air duct, a number of fins extending from the web within the outer air duct, and a wall extending from the web to form a portion of the outer air duct.

DETAILED DESCRIPTION OF THE INVENTION

Figure 1:
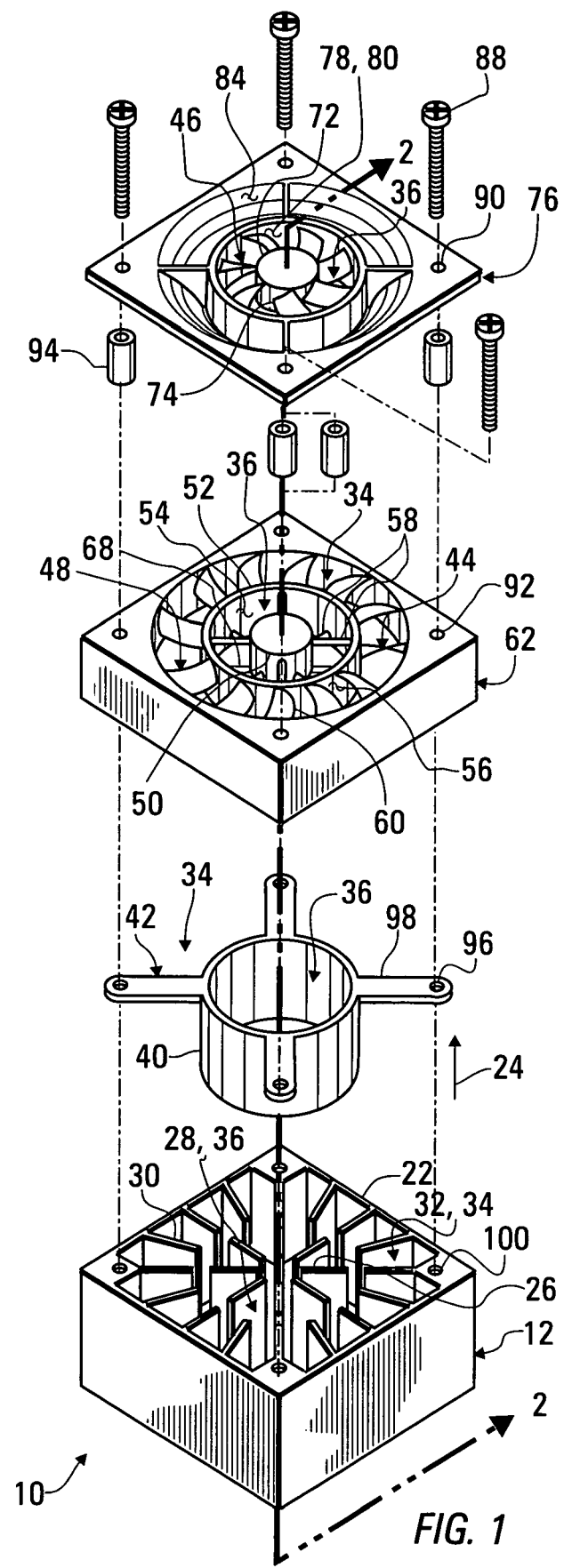
FIG. 1 is an exploded perspective view of the various elements of a structure for cooling an electronic component built in accordance with a first embodiment of the invention.
Figure 2:
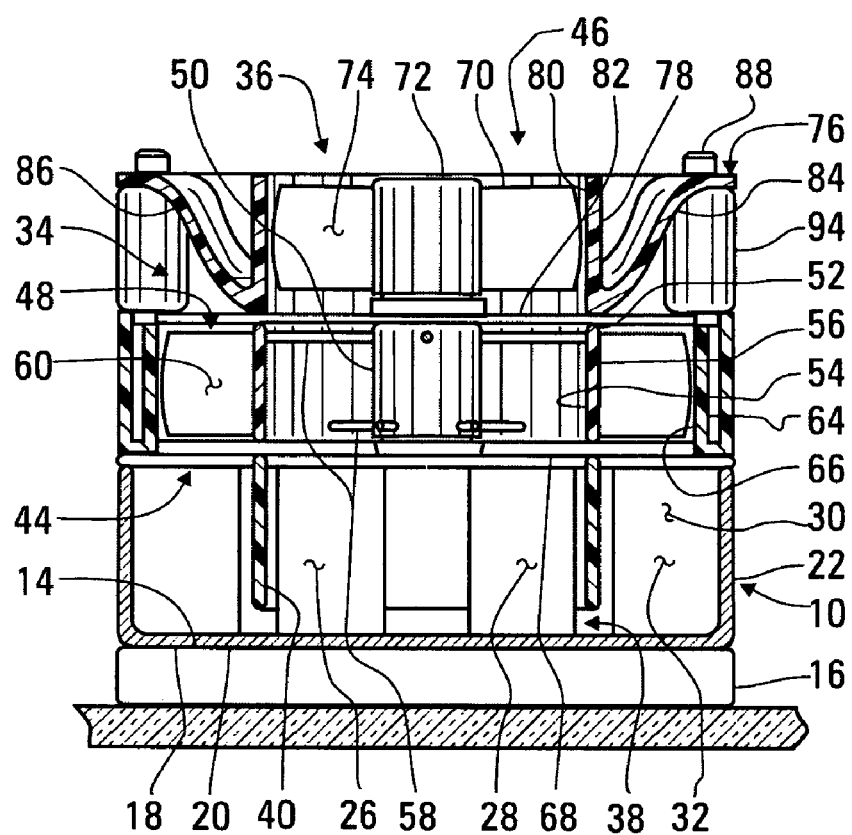
FIG. 2 is a cross-sectional elevation of the structure of FIG. 1, taken as indicated by section lines 2—2 therein and shown atop an electronic component being cooled.

A cooling structure built in accordance with a first embodiment of the invention will first be discussed, with reference being made to FIGS. 1 and 2. FIG. 1 is an exploded view of the various elements of the first embodiment cooling structure 10, while FIG. 2 is a cross-sectional elevation of this cooling structure 10, taken as indicated by section lines 2—2 in FIG. 1.

The cooling structure 10 includes a heat sink 12, attached to extend from a surface 14 of an electronic component 16 to be cooled. The heat sink 12 may be attached to the component by any of a number of means well known to those skilled in the relevant arts, with such means including mechanical attachment with clamps or fasteners and adhesive attachment. A thermally conductive grease may be applied to extend between the surface 14 of the electronic component and an adjacent surface 18 of a web 20 extending across the component 16 as a portion of the heat sink 12. The heat sink 12 additionally includes an outer wall 22, extending away from the web 20 in the direction of arrow 24, a number of inner fins 26 extending away from the web 20 within a central portion 28 of the heat sink 12, and a number of outer fins 30 extending away from the web 20 within an outer portion 32 of the heat sink 12.

The cooling structure 10 further includes an outer air duct 34, extending within the outer portion 32 of the heat sink 12 and away from this outer portion 32 in the direction of arrow 24, and an inner air duct 36 extending away from an opening 38 to the outer air duct 34 adjacent the central portion 28 of the heat sink 12. Thus, the inner fins 26 extend within a portion of the inner air duct 36, while the outer fins 30 extend within a portion of the outer air duct 34. The inner air duct extends within a cylindrical wall 40 of a baffle 42, with the opening 38 between the inner air duct 36 and the outer air duct 34 being formed within the space between the cylindrical wall 40 and the web 20 of the heat sink 12. The outer air duct 34 extends along the inner air duct 36, within an annular space around the inner air duct 36.

The cooling structure 10 additionally includes an outer fan 44 within the outer air duct 34 and an inner fan 46 within the inner air duct 36. The outer fan 44 and the inner fan 46 move air in opposite directions. That is, if the outer fan 44 moves air in the direction of arrow 24, the inner fan 46 moves air opposite the direction of arrow 24. Alternately, if the outer fan 44 moves air opposite the direction of arrow 24, the inner fan 46 moves air in the direction of arrow 24. This is accomplished either by configuring the blades of the two fans 44, 46 so that they are twisted in opposite directions, with the fans 44, 46 turning in the same direction, or by configuring the blade of the two fans 44, 46 so that they are twisted in the same direction, with the fans 44, 46 turning in the opposite directions.

The outer fan 44 includes an outer rotor 48 that is rotatably mounted at a first motor 50 disposed at a center of the outer rotor 48. The outer rotor 48 includes a first cylindrical wall 52 having an internal surface 54 forming a portion of the inner air duct 36 and an external surface 56 forming a portion of the outer air duct 34. The outer rotor 48 additionally includes a number of elongated members 58 extending between the internal surface 54 of the first cylindrical wall 52 and the first motor 50. A number of fan blades 60 extend outward from the outer surface 56 of the first cylindrical wall 52. An outer fan support structure 62 having a second cylindrical wall 64, with an internal surface 66 forming a portion of the outer air duct 34, and a number of elongated members 68 extending inward to attach the first motor 50 to the second cylindrical wall 64.

The inner fan 46 includes an inner rotor 70 that is rotatably mounted at a second motor 72 disposed at a center of the inner rotor 70, with the inner rotor 70 being spaced away from the outer rotor 48 in the direction of arrow 24. The inner rotor 70 includes a number of fan blades 74 extending outward from the second motor 72. An inner fan support structure 76 includes a third cylindrical wall 78, with an internal surface 80 forming a portion of the inner air duct 36, and a number of elongated members 82 extending inward to attach the second motor 72 to the third cylindrical wall 78. The inner fan support structure 76 additionally includes an outwardly curved wall 84, extending outward from the third cylindrical wall 78, having an outer surface 86 forming a portion of the outer air duct 34. Thus, both the inner and outer air ducts 36, 34 and the inner and outer fans 46, 44 are understood to be coaxial, having a common axis.

The cooling structure 10 is held together by a number of screws 88 extending through holes 90 in the inner fan support structure 76, through holes 92 in the outer fan support structure 62, through a number of spacers 94, and through holes 96 in elongated members 98 extending outward from the cylindrical wall 40 within the baffle 42 to engage threaded holes 100 within the heat sink 12.

Figures 3, 5:
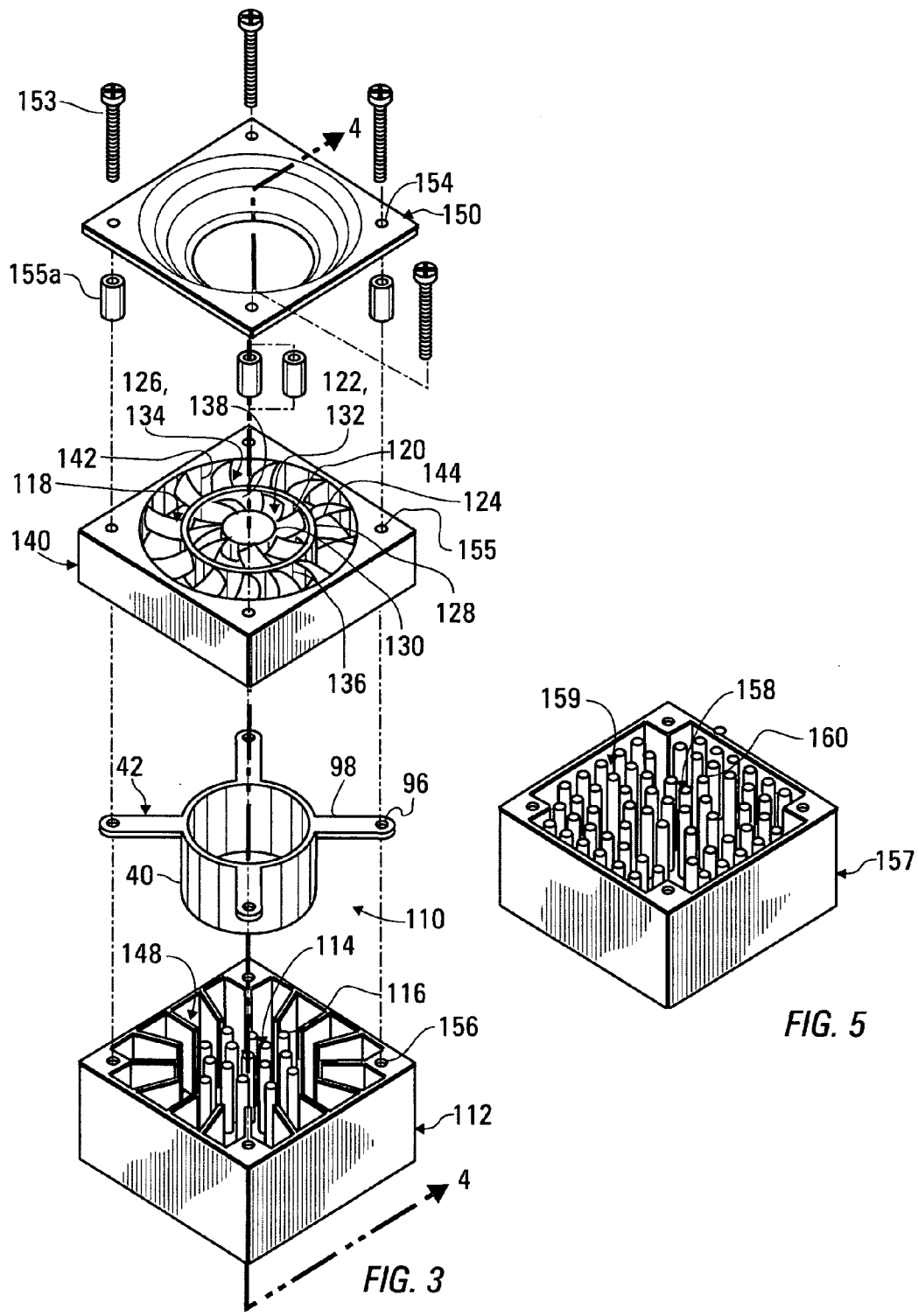
FIG. 3 is an exploded perspective view of the various elements of a structure for cooling an electronic component built in accordance with a second embodiment of the invention.
FIG. 5 is a perspective view of an alternative heat sink for use in the first or second embodiment of the invention.

A cooling structure built in accordance with a second embodiment of the invention will now be discussed in reference to FIGS. 3 and 4. FIG. 3 is an exploded view of this second cooling structure 110, while FIG. 4 is a cross-sectional elevation of this second cooling structure 110, taken as indicated by section lines 4—4 in FIG. 3.

The cooling structure 110 includes a heat sink 112, which is similar to the heat sink 12 described above in reference to FIGS. 1 and 2, except that the central portion 114 of heat sink 112 includes a number of cooling fins 116 shaped as columns instead of as tablets. The cooling structure 110 also includes a baffle 42, which is as described above, and which is therefore accorded like reference numbers.

The cooling structure 110 further includes a single rotor 118 including fan blades 120 of an inner fan 122 and fan blades 124 of an outer fan 126, with these blades 120, 124 being separated by a first cylindrical wall 128. The fans 122, 126 are twisted in opposite direction to move air in opposite directions with rotation of the single rotor 118, which is rotatably mounted on a motor 130 and driven in rotation by the motor 130. The inner fan 122 moves air within an inner air duct 132, while the outer fan 126 moves air within an outer air duct 134. The fan blades 120 of the inner fan 122 extend between the motor 120 and an inner surface 136 of the first cylindrical wall 128. This inner surface 136 forms a portion of the inner air duct 132. The fan blades 124 of the outer fan 126 extend outward from an outer surface 138 of the first cylindrical wall 128. This outer surface 138 forms a portion of the outer air duct 134. The cooling structure 110 additionally includes a fan support structure 140 having a cylindrical wall 142 with an internal surface 144 forming a portion of the outer air duct 134. The fan support structure 140 further includes a number of elongated members 146 extending inward from the cylindrical wall 142 to support the motor 130.

Figure 4:
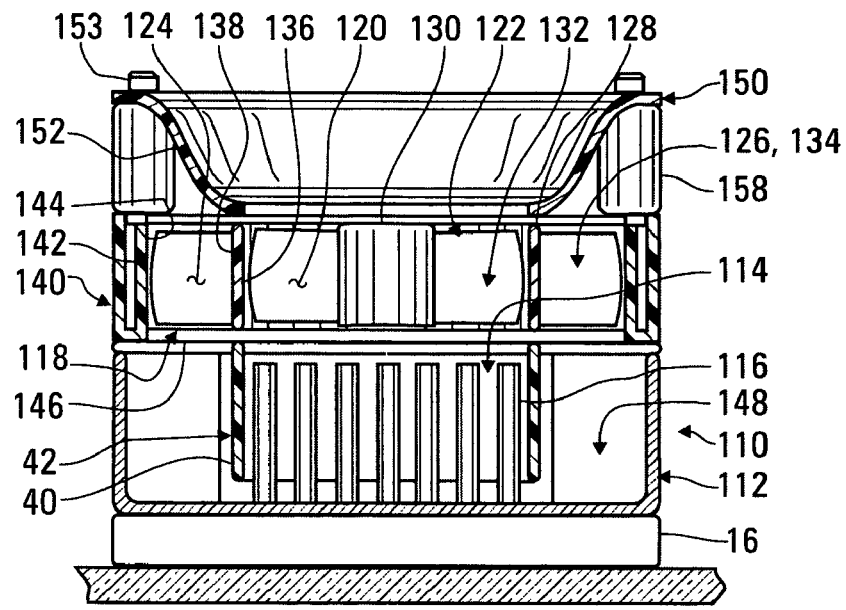
FIG. 4 is a cross-sectional elevation of the structure of FIG. 3, taken as indicated by section lines 4—4 therein and shown atop an electronic component being cooled.

This combination of features is meant to be exemplary, rather than to indicate that the heat sink features particularly described in reference to FIGS. 3 and 4 are suitable over the heat sink features described in reference to FIGS. 1 and 2 for use with the single rotor 118.

The inner air duct 132 extends within the cylindrical wall 40 of the baffle 42, into the central portion 114 of the heat sink 112, while the outer air duct 134 extends outside the cylindrical wall 40 into an outer portion 148 of this heat sink 112. The cooling structure 110 also includes an outwardly curved wall 150 having an outer surface 152 forming a portion of the outer air duct 134. Thus, both the inner and outer air ducts 132, 134 and the inner and outer fans 122, 126 are understood to be coaxial, having a common axis.

The cooling structure 110 is held together by a number of screws 153 extending through holes 154 in the outwardly curved wall 150, through holes 155 in the fan support structure 140, through a number of spacers 155a, and through holes 96 in elongated members 98 extending outward from the cylindrical wall 40 within the baffle 42 to engage threaded holes 156 within the heat sink 112.

FIG. 5 is a perspective view of the view of an alternative heat sink 157, which may be used in the first embodiment of the invention, discussed above in reference to FIGS. 1 and 2, or in the second embodiment of the invention, discussed above in reference to FIGS. 3 and 4. Both a central portion 158 of this heat sink 157 and an outer portion 159 thereof include cooling fins 160 shaped as columns, with the central and outer portions 157, 158 being separated by an annular space in which the circular wall 40 of the baffle 42 extends. The cooling fins 160 may be square, as shown, or round, and may be small enough to be part of an array of 20 by 20 columns within the heat sink 157.

Figure 6:
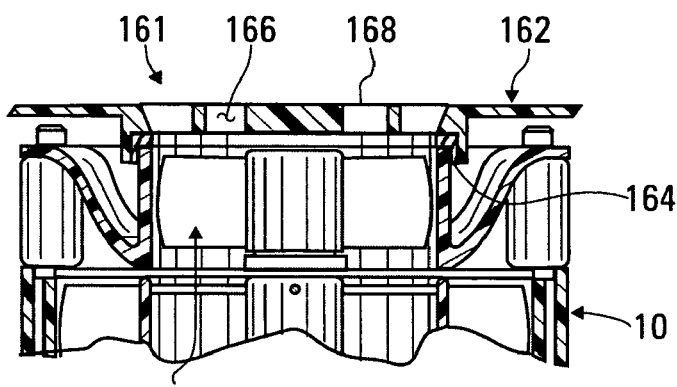
FIG. 6 is a fragmentary cross-sectional elevation of a version of the structure of FIG. 1 having an inner air duct outwardly connected to ambient air through an opening in a cover.

FIG. 6 is a fragmentary cross-sectional elevation of the cooling structure 10, built in accordance with the first embodiment of the invention, with the inner air duct 36 outwardly connected to ambient air through an opening 161 in an outer cover 162. A resilient gasket 164 may be provided to connect the cooling structure 10 with the cover 162. The opening 161 may be divided into a number of apertures 166 by portions 168 of the cover 162.

Figure 7:
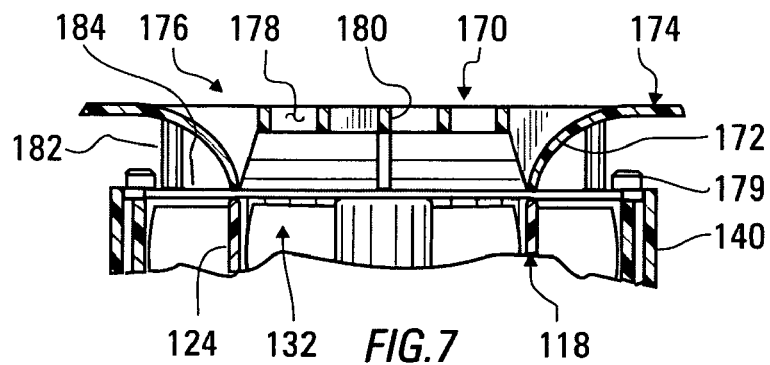
FIG. 7 is a fragmentary cross-sectional elevation of a cooling structure built in accordance with the second embodiment to have an inner air duct outwardly connected to ambient air through an opening in a cover.

FIG. 7 is a fragmentary cross-sectional elevation of a cooling structure 170, built in accordance with the second embodiment of the invention in a version including an outwardly curved wall 172 extending as a portion of the outer cover 174, so that the inner air duct 132 is outwardly connected with ambient air through an opening 176 in the outer cover 174. The opening 176 may be divided into a number of apertures 178 by portions 180 of the cover 174. The lower portion of the cooling structure 170, which is held together by screws 179 extending through the fan support structure 140, is otherwise as described above in reference to FIGS. 3 and 4. Spacers 182 extend downward as portions of the cover 174, contacting corner portions 184 of the fan support structure 140 to maintain a separation between the curved wall 172 and the rotating cylindrical wall 124 of the fan rotor 118.

The cooling structures described above in reference to FIGS. 6 and 7 can be configured to either discharge heated air outside a system through the inner air duct 36, 132 or to suck cool air inward from the outside through this air duct 36, 132. One advantage of sucking air toward the component being cooled, whether this air comes from outside or inside the system, is that the hottest parts of an electronic, which need cooling more than other parts of the component, are often near the center of the component. Whether air is discharged through the inner air duct or through the outer air duct, a cooling structure built in accordance with the invention has an advantage over prior art devices in that the air heated by the component is moved away from the circuit board on which the component rests, so that the effect of heat generated by the component on adjacent components is minimized.

While the invention has been shown and described in its preferred versions or embodiments with some degree of particularity, it is understood that this description has been given only by way of example, and that many variations can be achieved without departing from the spirit and scope of the invention, as defined in the appended claims.

What is claimed is:

1. Apparatus for cooling a component, wherein the apparatus comprises: a heat sink extending from a surface of the component, wherein the heat sink includes a central portion and an outer portion; an outer air duct including a first portion disposed within the outer portion of the heat sink and a second portion extending away from the outer portion of the heat sink; an inner air duct extending away from an opening to the outer air duct adjacent to the central portion of the heat sink, wherein the outer air duct extends along the inner air duct within an annular space around the inner air duct; an outer fan within the outer air duct, moving air in a first direction through the outer air duct; and an inner fan within the inner air duct, moving air opposite the first direction through the inner air duct.

2. The apparatus of claim 1, wherein
   the inner fan includes an inner rotor, spaced away from the outer fan, and
   the outer fan includes an outer rotor, turning separately from the inner rotor.

3. The apparatus of claim 2, wherein
   the inner rotor turns at a first rotational speed, and
   the outer rotor turns at a second rotational speed, substantially slower than the first rotational speed.

4. The apparatus of claim 2, wherein the inner and outer rotors turn in opposite directions.

5. The apparatus of claim 2, wherein
   the outer rotor is rotatably mounted at a first motor disposed at a center of the outer rotor, and
   the outer rotor includes a first cylindrical wall having an inner surface forming a portion of the inner air duct and an outer surface forming a portion of the outer air duct, a plurality of elongated members extending between the inner surface of the first cylindrical wall and the first motor, and a plurality of fan blades extending outward from the outer surface of the first cylindrical wall to move air in the first direction through the outer air duct.

6. The apparatus of claim 5, additionally comprising:
   a second cylindrical wall having an internal surface forming a portion of the outer air duct, disposed outwardly around the plurality of fan blades of the outer rotor; and
   a plurality of elongated members extending inward from the second cylindrical wall to attach the first motor to the second cylindrical wall.

7. The apparatus of claim 5, wherein
   the inner rotor is rotatably mounted at a second motor disposed at a center of the inner rotor, and
   the inner rotor includes a plurality of blades extending outward from the second motor.

8. The apparatus of claim 7, additionally comprising
   a third cylindrical wall having a an inner surface forming a portion of the inner air duct, and
   a plurality of elongated members extending inward from the third cylindrical wall to attach the second motor to the third cylindrical wall.

9. The apparatus of claim 7, additionally comprising an outwardly curved wall extending outward from the third cylindrical wall, having an outer surface forming a portion of the outer air duct.

10. The apparatus of claim 1, additionally comprising a rotatably mounted rotor, wherein:
    the inner fan includes blades extending within an inner portion of the rotor, and
    the outer fan includes blades extending within an outer portion of the rotor.

11. The apparatus of claim 10, wherein
    the rotor is rotatably mounted at a motor disposed at a center of the rotor, and
    the rotor includes a first cylindrical wall having an internal surface forming a portion of the inner air duct and an outer surface forming a portion of the outer air duct, a plurality of blades extending between the inner surface of the first cylindrical wall and the motor to move air opposite the first direction through the inner air duct, and a plurality of fan blades extending outward from the outer surface of the first cylindrical wall to move air in the first direction through the outer fan duct.

12. The apparatus of claim 11, additionally comprising:
    a second cylindrical wall having an internal surface forming a portion of the outer air duct, disposed outwardly around the plurality of fan blades extending outward from the outer surface of the cylindrical wall, and
    a plurality of elongated members extending inward from the second cylindrical wall to attach the motor to the second cylindrical wall.

13. The apparatus of claim 12, additionally comprising an outwardly curved wall, extending from the third cylindrical wall, having an outer surface forming a portion of the outer air duct and an inner surface forming a portion of the inner air duct.

14. The apparatus of claim 1, additionally comprising an outwardly curved wall, extending as a portion of an outer cover to connect the inner air duct with ambient air.

15. The apparatus of claim 1, wherein the heat sink includes:
    a web extending along the surface of the component;
    a plurality of fins extending from the web within the inner air duct, and
    a plurality of fins extending from the web within the outer air duct.

16. The apparatus of claim 15, wherein the heat sink additionally includes an outer wall extending from the web to form a portion of the outer air duct.

17. The apparatus of claim 1, wherein the first direction is away from the heat sink.

18. The apparatus of claim 1, wherein the first direction is toward the heat sink.

19. A fan rotor, rotatably mounted within an outer air duct at a motor disposed at a center of the rotor, wherein the rotor comprises:
    a cylindrical wall;
    a plurality of elongated members extending from the cylindrical wall to the motor through a space forming an inner air duct, and
    a plurality of blades extending outward from the cylindrical wall to move air through the outer air duct with rotation of the rotor.

20. A fan rotor, rotatably mounted within an outer air duct at a motor disposed at a center of the rotor, wherein the rotor comprises:
    a cylindrical wall;
    a plurality of blades extending outward from the cylindrical wall to move air through the outer air duct in a first direction with rotation of the rotor in a direction of rotation; and
    a plurality of blades extending between the cylindrical wall and the motor to move air through an inner air duct within the outer air duct in a direction opposite the first direction with rotation of the rotor in the direction of rotation.

* * * * *